US009847785B2

United States Patent
Nakai (10) Patent No.: US 9,847,785 B2
(45) Date of Patent: Dec. 19, 2017

(54) PHASE LOCKED LOOP CIRCUIT AND METHOD OF FREQUENCY ADJUSTMENT OF INJECTION LOCKED FREQUENCY DIVIDER

(71) Applicant: MITSUBISHI ELECTRIC CORPORATION, Chiyoda-ku, Tokyo (JP)

(72) Inventor: Takayuki Nakai, Tokyo (JP)

(73) Assignee: MITSUBISHI ELECTRIC CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 15/111,701

(22) PCT Filed: Mar. 13, 2014

(86) PCT No.: PCT/JP2014/056623
§ 371 (c)(1),
(2) Date: Jul. 14, 2016

(87) PCT Pub. No.: WO2015/136659
PCT Pub. Date: Sep. 17, 2015

(65) Prior Publication Data
US 2016/0336944 A1 Nov. 17, 2016

(51) Int. Cl.
*H03L 7/183* (2006.01)
*H03K 23/58* (2006.01)
(Continued)

(52) U.S. Cl.
CPC .............. *H03L 7/183* (2013.01); *H03K 23/58* (2013.01); *H03L 7/0891* (2013.01); *H03L 7/095* (2013.01); *H03L 7/10* (2013.01); *H03L 7/1075* (2013.01)

(58) Field of Classification Search
CPC .......... H03K 23/00; H03K 23/58; H03L 7/00; H03L 7/0891; H03L 7/0893;
(Continued)

(56) References Cited

U.S. PATENT DOCUMENTS 4,347,484 A 8/1982 Vandegraaf
6,097,227 A 8/2000 Hayashi
(Continued)

FOREIGN PATENT DOCUMENTS

JP 57-25728 A 2/1982
JP 1141091 A 2/1999
(Continued)

OTHER PUBLICATIONS

International Search Report (PCT/ISA/210) dated Jun. 17, 2014, by the Japanese Patent Office as the International Searching Authority for International Application No. PCT/JP2014/056623.
(Continued)

*Primary Examiner* — Lincoln Donovan
*Assistant Examiner* — David Mattison
(74) *Attorney, Agent, or Firm* — Buchanan Ingersoll & Rooney PC (57) ABSTRACT

In a PLL circuit, first an ILFD is connected to an output voltage Vtune from an LPF, thereby causing the ILFD to operate as an oscillator. The ILFD, a DIV, PFD, CP, and LPF form a PLL and thereby locking operations are initiated. When a predetermined time elapses, an output frequency from the ILFD converges into a certain value and the PLL is subjected to a locked state. After the locked state is reached, a sample hold circuit SH holds the output voltage Vtune from the loop filter as of that time and frequency adjustment of the ILFD is completed. Similar frequency adjustment is sequentially performed on other ILFDs.

14 Claims, 10 Drawing Sheets

(51) Int. Cl.
*H03L 7/095* (2006.01)
*H03L 7/10* (2006.01)
*H03L 7/107* (2006.01)
*H03L 7/089* (2006.01)

(58) Field of Classification Search
CPC ..... H03L 7/0895; H03L 7/0896; H03L 7/095; H03L 7/10; H03L 7/1075; H03L 7/18; H03L 7/183
USPC .......................................................... 327/157
See application file for complete search history.

(56) References Cited

U.S. PATENT DOCUMENTS

| | | | |
|---|---|---|---|
| 7,856,212 B2 | 12/2010 | Pellerano et al. | |
| 8,804,875 B1 | 8/2014 | Xu et al. | |
| 9,083,588 B1 | 7/2015 | Xu et al. | |
| 2008/0238495 A1 | 10/2008 | Tachibana et al. | |
| 2011/0187469 A1 | 8/2011 | Okada et al. | |
| 2012/0038396 A1 | 2/2012 | Shima et al. | |
| 2012/0161835 A1* | 6/2012 | David | H03L 7/146 327/157 |
| 2013/0120073 A1 | 5/2013 | Okada et al. | |
| 2013/0141146 A1 | 6/2013 | Shima | |
| 2013/0195157 A1 | 8/2013 | Xu | |
| 2013/0195223 A1 | 8/2013 | Xu | |
| 2013/0195224 A1 | 8/2013 | Xu | |
| 2014/0023163 A1 | 1/2014 | Xu | |
| 2014/0043103 A1* | 2/2014 | Taghivand | H03B 19/14 331/34 |
| 2014/0120847 A1 | 5/2014 | Shima | |
| 2014/0185708 A1 | 7/2014 | Xu et al. | |
| 2014/0266454 A1 | 9/2014 | Testi et al. | |
| 2014/0266480 A1 | 9/2014 | Li et al. | |
| 2014/0269999 A1 | 9/2014 | Cui et al. | |
| 2014/0270003 A1 | 9/2014 | Xu et al. | |
| 2015/0326230 A1 | 11/2015 | Xu et al. | |

FOREIGN PATENT DOCUMENTS

| | | |
|---|---|---|
| JP | 2001339298 A | 12/2001 |
| JP | 2008-236557 A | 10/2006 |
| JP | 2007-208589 A | 8/2007 |
| JP | 2009-225438 A | 10/2009 |
| JP | 2011-160276 A | 8/2011 |
| JP | 2013-106062 A | 5/2013 |
| JP | 2014204418 A | 10/2014 |
| WO | WO 2011/089918 A1 | 7/2011 |
| WO | WO 2012/120795 A1 | 9/2012 |
| WO | WO 2013/140755 A1 | 9/2013 |

OTHER PUBLICATIONS

Ikeda, S. et al., "A Low Voltage Phase-Locked Loop with Digitally Calibrated Injection Locked Frequency Divider and Linearized Varactor", Proceedings of the 2013 IE ICE Electronics Society Conference 2, p. 94, Sep. 18, 2013.

Changhua, C. et al, "A 50-GHz Phase-Locked Loop in 0.13-μm CMOS, IEEE Journal of Solid-State Circuits", vol. 42, No. 8, pp. 1649-1656, Aug. 2007.

Office Action issued by the Japanese Patent Office dated Mar. 28, 2017 in corresponding Japanese Application No. 2016-507196 with Partial English language translation (5 pages).

* cited by examiner

PHASE LOCKED LOOP CIRCUIT AND METHOD OF FREQUENCY ADJUSTMENT OF INJECTION LOCKED FREQUENCY DIVIDER

TECHNICAL FIELD

The present invention relates to phase locked loop (PLL) circuits and particularly to a technique of frequency adjustment of an injection locked frequency divider (ILFD).

BACKGROUND ART

In order to implement both of increasing an operation frequency and downsizing/reducing power consumption of a PLL circuit, there are cases where an ILFD is used as a prescaler to divide a frequency of output from a voltage controlled oscillator (VCO). The ILFD is based on a phenomenon called injection locking. When an oscillator having a free-run frequency is input with a signal externally, the oscillator outputs a signal in synchronization with a frequency equivalent to that of the input signal divided by an integer. As compared to frequency dividers of an emitter coupled logic (ECL) type or current mode logic (CML) type which have been conventionally in use as a prescaler, the ILFD has an advantage that an operation frequency can be increased and that current consumption can be reduced.

Meanwhile, the ILFD has a characteristic that the ILFD can operate only around the free-run frequency. Therefore, there is a problem that, for example when characteristics of an element varies due to production conditions, temperature, or a source voltage and thereby the free-run frequency of the frequency divider deviates from a desired operation frequency, operations of frequency division may be disabled.

In order to solve this problem, a method has been proposed for measuring a free-run frequency of an ILFD including an adjustment circuit of the ILFD and having an adjustment means of the free-run frequency, calculating a difference from a desired frequency, and thereby controlling the free-run frequency of the ILFD (Patent Literature 1).

CITATION LIST

Patent Literature

Patent Literature 1: JP 2008-236557 A

SUMMARY OF INVENTION

Technical Problem

When such an adjustment means of a free-run frequency of an ILFD is used as Patent Literature 1, in addition to essential configuration elements of a PLL, required are a means to measure a frequency such as a frequency counter and an arithmetic means to generate, by arithmetic operations, a free-run frequency control signal of an injection locked frequency divider from a difference between the measured free-run frequency and a desired frequency. Therefore, there is a problem that a configuration of a circuit becomes complicated.

An object of the present invention is to implement adjustment of a free-run frequency of an ILFD with a simple configuration.

Solution to Problem

A phase locked loop circuit according to the present invention includes:

an oscillator to output an oscillation signal having a frequency;

a first injection locked frequency divider to be input with the oscillation signal having the frequency output from the oscillator;

a filter to output a voltage to the oscillator; and a supply unit, including:

an output voltage supply unit to fetch the output voltage output from the filter to the oscillator and to supply or block the fetched output voltage to the injection locked frequency divider; and a hold voltage supply unit to hold the output voltage from the filter and to supply the held output voltage to the injection locked frequency divider when the output voltage supply unit blocks the output voltage.

Advantageous Effects of Invention

The present invention allows for frequency adjustment of an ILFD with a simple circuit configuration without requiring a frequency measuring means, arithmetic means, or the like. Thus, stable operations of frequency division can be ensured with a simple configuration.

DESCRIPTION OF EMBODIMENTS

First Embodiment

Figure 1:
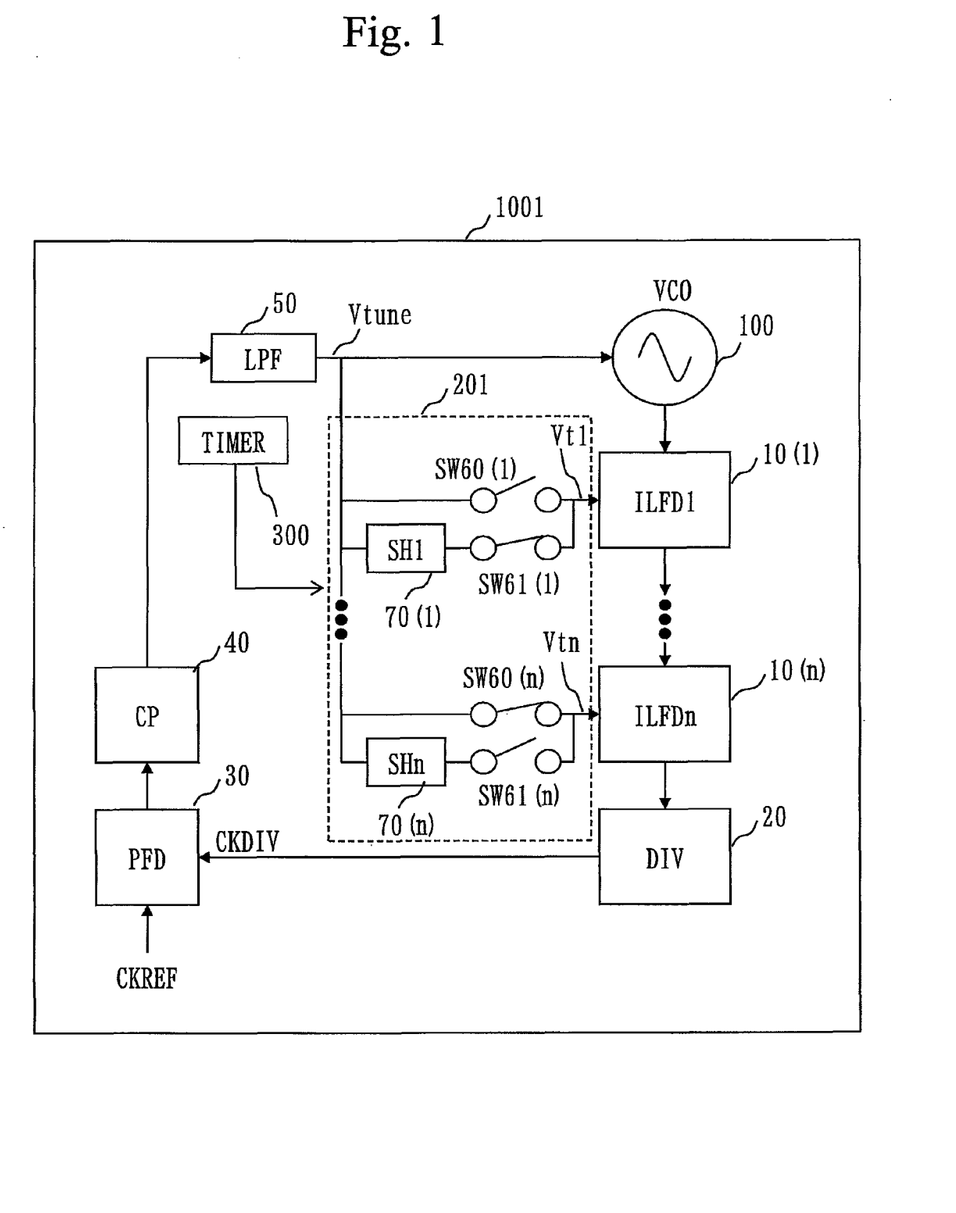
FIG. 1 is a block diagram of a PLL circuit 1001 of a first embodiment.

FIG. 1 is a block diagram illustrating a PLL circuit 1001 of a first embodiment.

Figure 2:
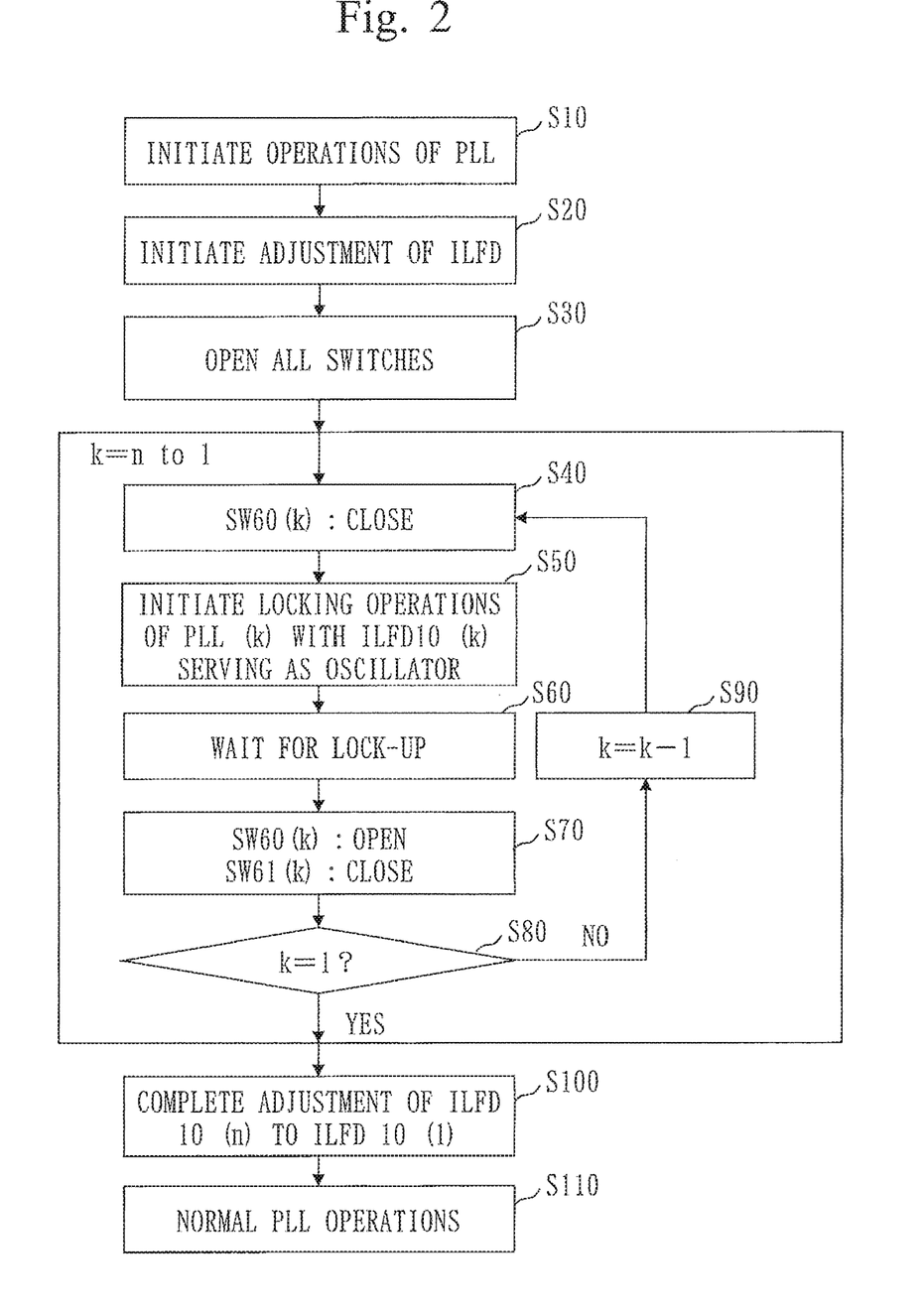
FIG. 2 is a flowchart of operations of the PLL circuit 1001 of the first embodiment.

FIG. 2 is a flowchart illustrating operations of the PLL circuit 1001. The PLL circuit 1001 allows for inputting an oscillator control voltage output from a loop filter to an injection locked frequency divider (ILFD) and configuring a PLL by forming a loop with the ILFD operating as an oscillator, thereby implementing adjustment of a free-run frequency of the ILFD.

As in FIG. 1, the PLL circuit 1001 includes n (where n is an integer greater than or equal to 1) injection locked frequency dividers 10 serially connected with each other, a frequency divider 20, a phase frequency detector 30, a charge pump 40, a loop filter 50 (filter), n switches 60, n switches 61, n sample hold circuits 70, a voltage controlled oscillator 100 (oscillator), and a timer circuit 300.

In the descriptions below, (1) The n injection locked frequency dividers 10 are noted as ILFD 10 (1), ILFD 10 (2), ILFD 10 (n). When there is no need to distinguish, the n injection locked frequency dividers 10 are noted as ILFD 10.

(2) The frequency divider 20 is noted as DIV 20.

(3) The phase frequency detector 30 is noted as PFD 30.

(4) The charge pump 40 is noted as CP 40.

(5) The loop filter 50 is noted as LPF 50.

(6) The n switches 60 are noted as SW 60 (1), SW 60 (2), ... SW 60 (n). When there is no need to distinguish, the n switches 60 are noted as SW 60.

(7) The n sample hold circuits 70 are noted as SH 70 (1), SH 70 (2), ... SH 70 (n). When there is no need to distinguish, the n sample hold circuits 70 are noted as SH 70.

(8) The n switches 61 are noted as SW 61 (1), SW 61 (2), ... SW 61 (n). When there is no need to distinguish, the n switches 61 are noted as SW 61.

(1) The n ILFD 10 (1) to ILFD 10 (n) are serially connected with each other. The serially connected ILFD 10 (1) to ILFD 10 (n) divide an output frequency at a predetermined frequency division ratio upon receiving the output frequency from the voltage controlled oscillator 100 (hereinafter noted as VCO 100) having varying oscillation frequencies corresponding to an input voltage from a frequency control terminal. The VCO 100 outputs an oscillation signal having a frequency corresponding to the input voltage from the frequency control terminal.

(2) The DIV 20 divides an output frequency from the ILFD 10 (n) at a predetermined frequency division ratio.

(3) The PFD 30 detects a phase difference between a signal resulted from frequency division (noted as CKDIV) output from the DIV 20 and a reference clock (noted as CKREF).

(4) The CP 40 outputs a current or voltage upon receiving output from the PFD 30.

(5) The LPF 50 smoothes the output from the CP 40 and outputs a frequency control voltage Vtune.

(6) The SW 60 (1) to SW 60 (n) selects whether to supply the control voltage Vtune to the ILFD 10 (1) to ILFD 10 (n).

(7) The SH 70 (1) to SH 70 (n) samples and holds a control voltage for the ILFD 10 (1) to ILFD 10 (n).

(8) The SW 61 (1) to SW 61 (n) selects whether to supply the output voltage from the SH 70 (1) to SH 70 (n) to the ILFD 10 (1) to ILFD 10 (n), respectively.

(9) The timer circuit 300 controls the SW 60, SW 61, SH 70, and ILFD 10 as well as a DA 80 and AD 90. The DA 80 and AD 90 will be described later.

In FIG. 1, the supply unit 201 includes the SW 60 (1) to SW 60 (n), SW 61 (1) to SW 61 (n), and SH 70 (1) to SH 70 (n). The SW 60 (1) to SW 60 (n) fetches the output voltage output from the LPF 50 to the VCO 100 and supplies or blocks the fetched output voltage to the ILFD 10 (1) to ILFD 10 (n). The SW 60 (1) to SW 60 (n) form an output voltage supply unit. The SW 61 (1) to SW 61 (n) and SH 70 (1) to SH 70 (n) supply a held output voltage to the ILFD 10 (1) to ILFD 10 (n) when the SW 60 (1) to SW 60 (n) block the output voltage. The SW 61 (1) to SW 61 (n) and SH 70 (1) to SH 70 (n) form a hold voltage supply unit.

Hereinafter, operations of the PLL circuit 1001 will be described with FIGS. 1 and 2. In FIG. 2, the timer circuit 300 is the subject of the operations.

First, upon initiation of operation of the PLL circuit 1001 (S10), none of the ILFD 10 is adjusted of a free-run frequency and thus adjustment operations of the ILFD 10 is initiated (S20).

When adjustment of the ILFD 10 is initiated, first the timer circuit 300 releases all of the switches (SW 60 (1) to SW 60 (n) and SW 61 (1) to SW 61 (n)) (S30). Next, adjustment is initiated from with the ILFD 10 (n) having the lowest operation frequency in the ILFD 10 (1) to ILFD 10 (n) and connected to the DIV 20 (S40). Therefore, the timer circuit 300 causes the SW 60 (n), connecting the output voltage Vtune from the LPF 50 to the ILFD 10 (n), to close and thereby causing the ILFD 10 (n) to operate as an oscillator (S50). This allows for forming a loop PLL (n) including the ILFD 10 (n), DIV 20, PFD 30, CP 40, and LPF 50 and thereby initiating locking operations. When a certain time elapses, the output frequency from the ILFD 10 (n) converges into a certain value and the loop PLL (n) is subjected to a locked state (S60). In S60, it is assumed that the locked state is reached when a certain time elapses. Note that a configuration including a lock detector to detect the locked state will be described later in a fourth embodiment.

After the loop PLL (n) is subjected to the locked state, the timer circuit 300 causes the SH 70 (n) to hold the output voltage Vtune from the LPF 50 as of that time while releasing the SW 60 (n) and closing the SW61(n) to complete frequency adjustment of the ILFD 10 (n) (S70). Hereinafter, the timer circuit 300 adjusts the ILFD 10 (n−1) to ILFD 10 (1) in the order mentioned in a similar procedure (S80 and S90).

When adjustment of all of the ILFD 10 is completed (S100), the timer circuit 300 forms a PLL including the VCO 100, ILFD 10 (1) to ILFD 10 (n), DIV 20, PFD 30, CP 40, and LPF 50 and thereby initiates locking operations (normal PLL operations) (S110). This allows for implementing adjustment of the ILFD 10 only by adding the SW 60 (1) to SW 60 (n), SH 70 (1) to SH 70 (n), and SW 61 (1) to SW 61 (n) without requiring a frequency measuring means or arithmetic means.

Here, the operation S30 in FIG. 2 is a so-called reset (initializing) operation. A state of the ILFD 10 is determined by the adjustment operations of S40 and the subsequent steps and thus, as a result, this reset operation S30 does not influence the normal PLL operations S110. Therefore, the reset operation S30 may be omitted.

Figure 3:
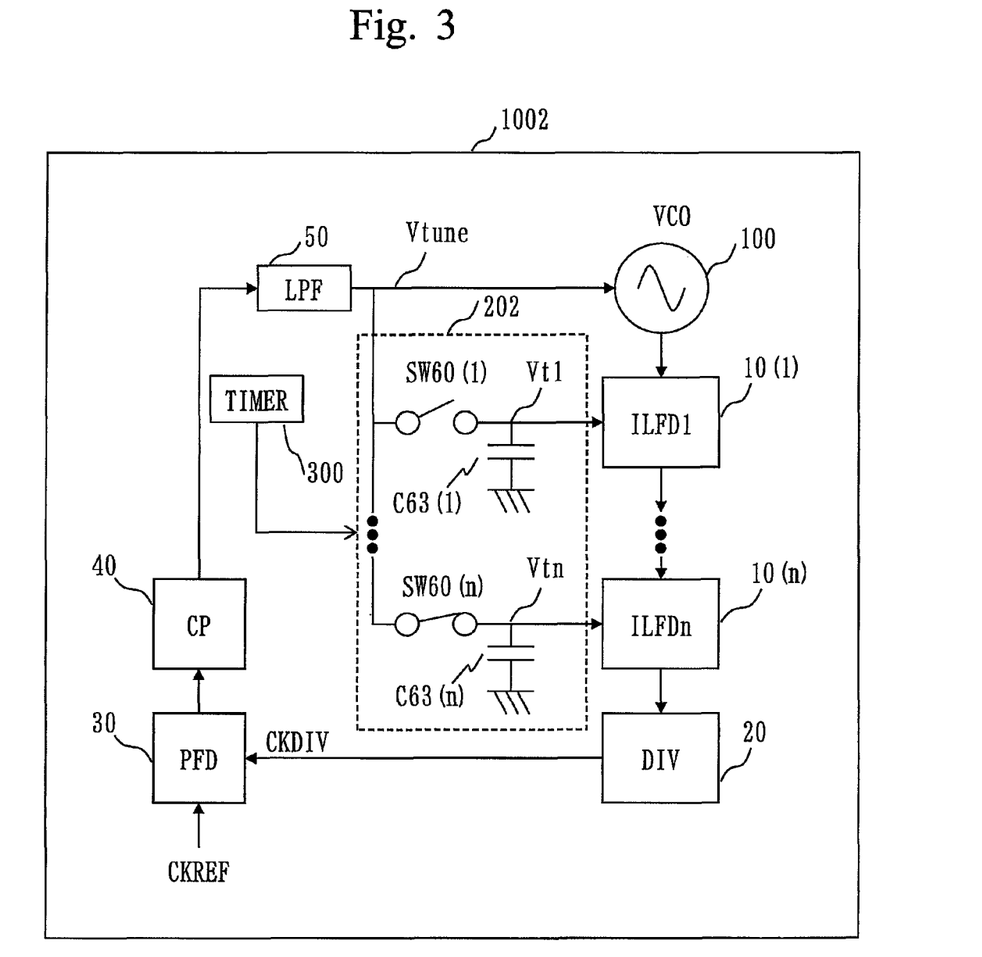
FIG. 3 is a block diagram of a PLL circuit 1002 of the first embodiment.

FIG. 3 is a configuration diagram of the PLL circuit 1002. As compared to FIG. 1, a supply unit 202 is different. FIG. 3 is a diagram illustrating the supply unit 202 with a simpler configuration that of the supply unit 201 in FIG. 1. The supply unit 202 includes SW 60 (1) to SW 60 (n) and sampling capacitors C 63 (1) to C 63 (n). In FIG. 3, the supply unit 201 (the sample hold circuit SH 70 and switches SW 60 and SW61) in FIG. 1 is configured by the switch SW 60 connected between output from the LPF 50 and a control terminal of the ILFD 10 and the sampling capacitor C63 connected between the control terminal of the ILFD 10 and a predetermined reference voltage (e.g. ground).

FIG. 3 is a diagram of a configuration with the switch and sampling capacitor. This configuration allows for implementing the supply unit 202 by the SW 60 (1) to SW 60 (n) and sampling capacitors C 63 (1) to C 63 (n) corresponding to the SW 60 (1) to SW 60 (n). Therefore, the SW 61 (1) to SW 61 (n) in FIG. 1 are not required. In the supply unit 202, the SW 60 (1) to SW 60 (n) form an output voltage supply unit while the sampling capacitors C 63 (1) to C 63 (n) form a hold voltage supply unit. Note that the supply unit 202 corresponds to the SH 70 (1) to SH 70 (n) in FIG. 1.

Figure 4:
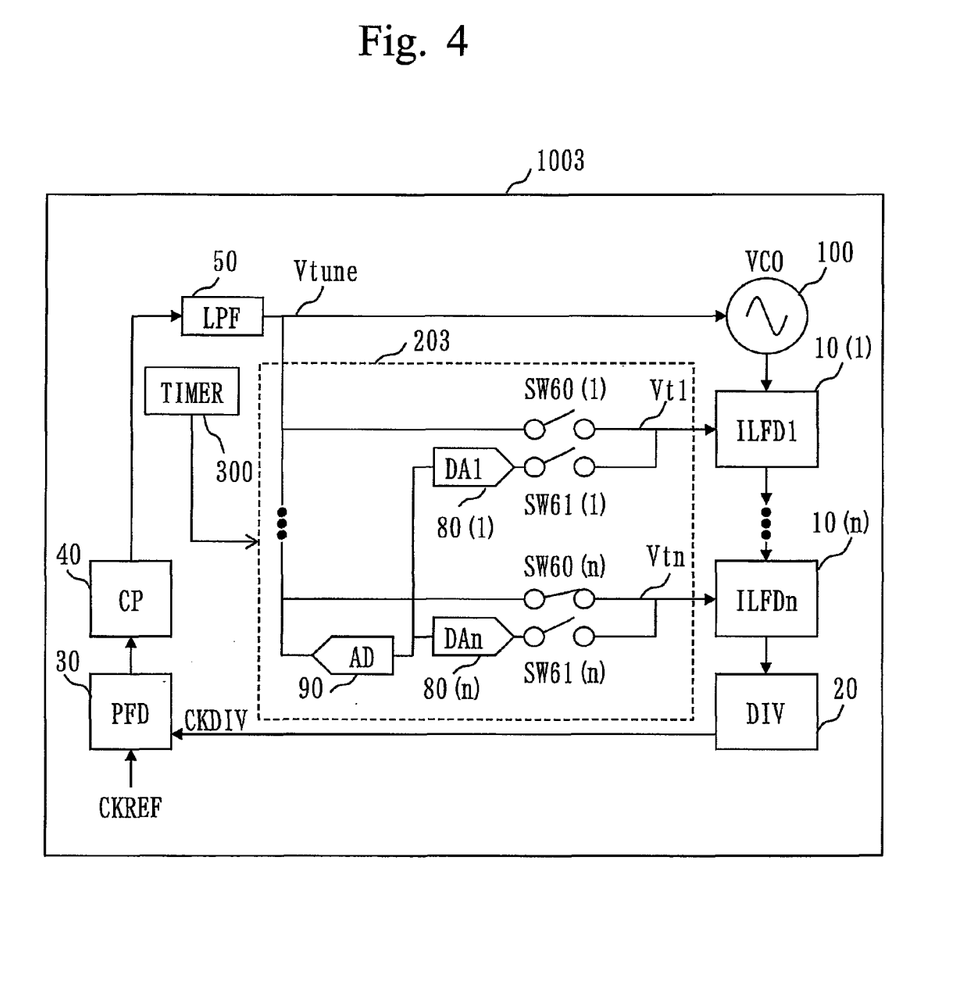
FIG. 4 is a block diagram of a PLL circuit 1003 of the first embodiment.

FIG. 4 is a configuration diagram of a PLL circuit 1003. As compared to FIG. 1, a supply unit 203 is different. FIG. 4 is a diagram illustrating a configuration of the supply unit 203 which is different from the supply unit 201. In FIG. 4, the SH 70 in FIG. 1 is implemented by n digital/analog converters 80 (noted as DA 80) and one analog/digital converter 90 (noted as AD 90). The n DAs 80 are noted as DA 80 (1) to DA 80 (*n*). A case where the AD 90 is one in number is illustrated in FIG. 4; however, the AD 90 may be provided to each of the DA 80 (1) to DA 80 (*n*).

As illustrated in FIG. 4, the supply unit 203 includes SW 60 (1) to SW 60 (*n*), SW 61 (1) to SW 61 (*n*), the DA 80 (1) to DA 80 (*n*) and AD 90. The DA 80 (1) to DA 80 (*n*) and AD 90 correspond to the SH 70 (1) to SH 70 (*n*) in FIG. 1. The SW 60 (1) to SW 60 (*n*) form an output voltage supply unit. The DA 80 (1) to DA 80 (*n*), AD 90, and SW 61 (1) to SW 61 (*n*) form a hold voltage supply unit.

Figure 5:
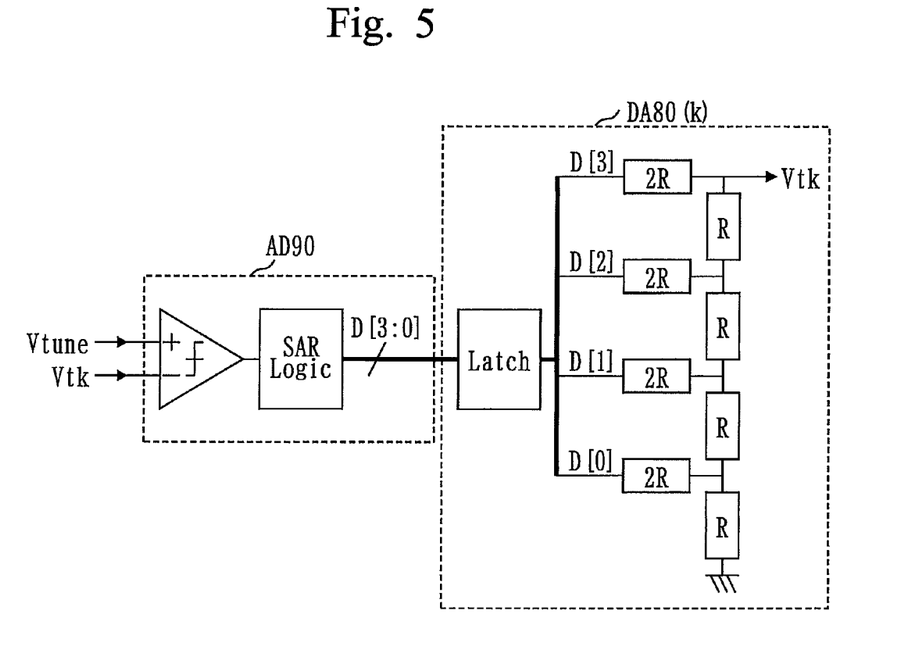
FIG. 5 is a block diagram illustrating an analog/digital converter and digital/analog converter used in a sample hold circuit of the first embodiment.

FIG. 5 is a diagram illustrating a specific configuration of the DA 80 (1) to DA 80 (*n*) and AD 90. As illustrated in FIG. 5, the DA 80 (1) to DA 80 (*n*) are DA converters of an R-2R type. The AD 90 includes a voltage comparator and a successive approximation resister (SAR) control logic. Coupling the AD 90 and DA 80 (*k*) (k=1, 2, . . . n) forms one AD converter of the SAR type. The SAR-type AD converter performs AD conversion of Vtune and holds the voltage, thereby allowing for implementing sample-and-hold operations.

As illustrated in FIGS. 4 and 5, a simple configuration including the AD converter, DA converter, and switches can adjust the ILFD 10.

Second Embodiment

Figure 6:
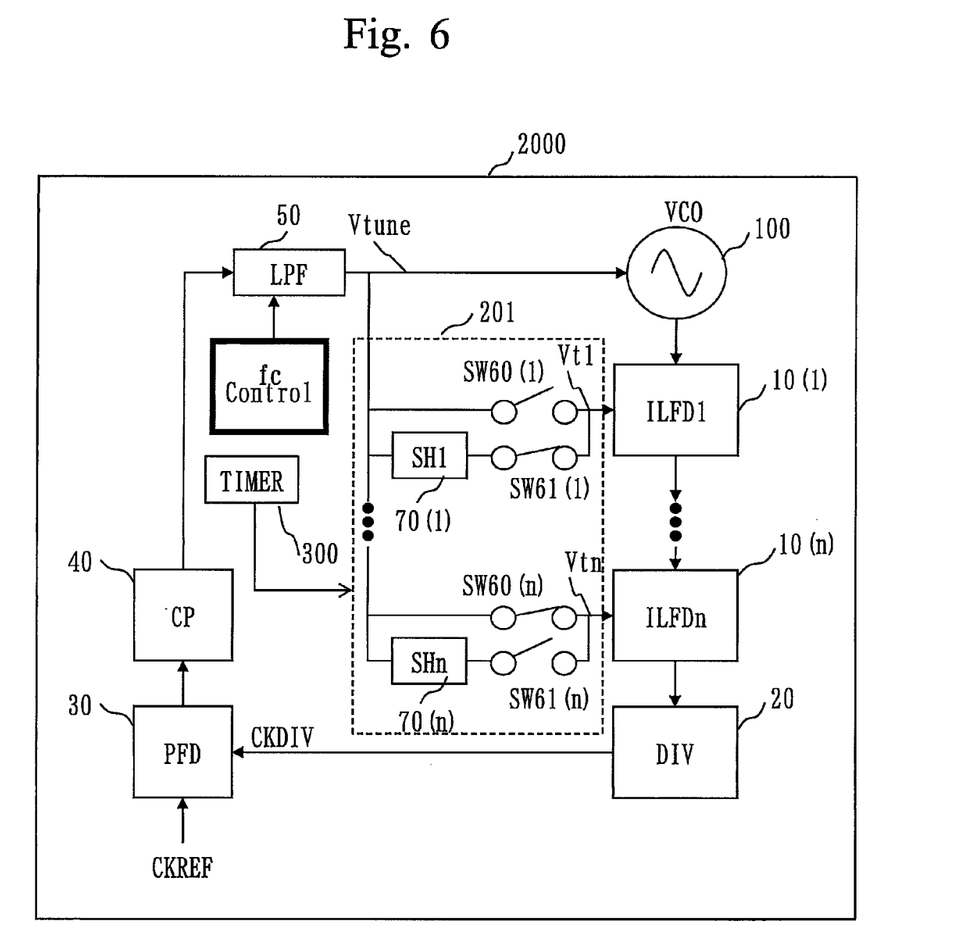
FIG. 6 is a block diagram of a PLL circuit 2000 of a second embodiment.

FIG. 6 is a block diagram illustrating a PLL circuit 2000 of a second embodiment. Here, only different points from the PLL circuit 1001 of the first embodiment will be described. In the PLL circuit 2000 of the second embodiment, the LPF 50 is controlled and thereby a cut-off frequency switches between a normal time and a time of ILFD adjustment.

A convergence time and stability of the PLL are dependent on the cut-off frequency of the loop filter. Therefore, by switching the cut-off frequency of the loop filter, for example by setting a low cut-off frequency at the normal time, phase noise is mitigated and by setting a higher cut-off frequency at the time of adjustment than at the normal time, the convergence time is shortened. In this manner, when the cut-off frequency of the LPF 50 can be changed, response characteristics of the PLL can be maintained in an appropriate manner at each of the normal time and the time of adjustment.

Third Embodiment

Figure 7:
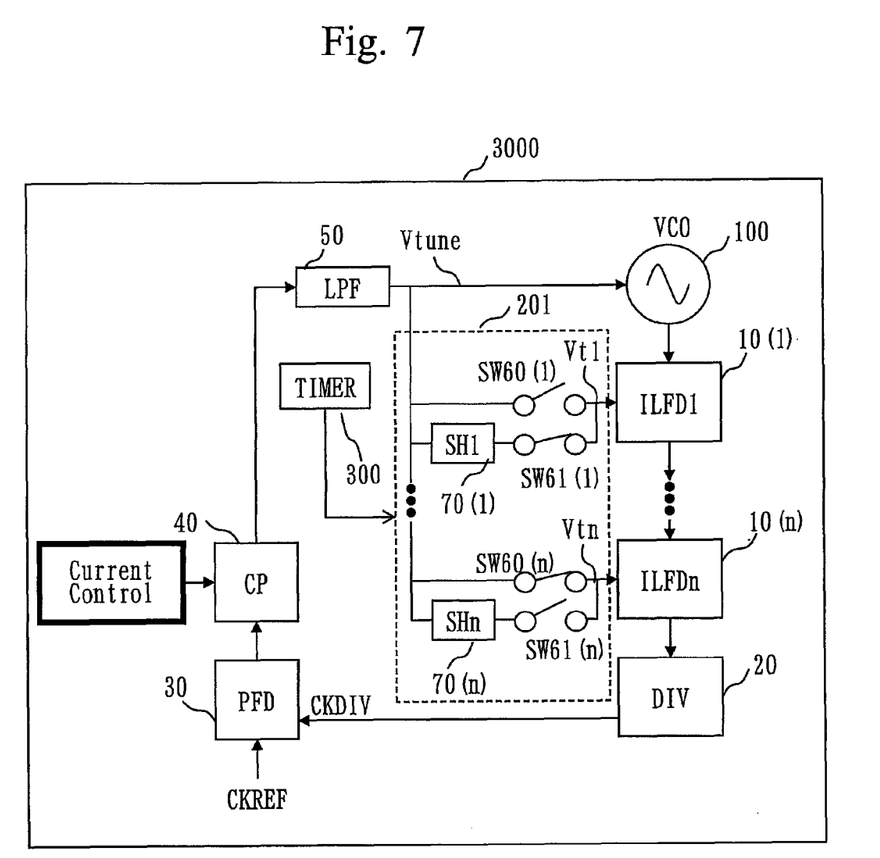
FIG. 7 is a block diagram of a PLL circuit 3000 of a third embodiment.

FIG. 7 is a block diagram illustrating a PLL circuit 3000 of a third embodiment. Here, only different points from the PLL circuit 1001 of the first embodiment will be described. In the PLL circuit 3000 of the third embodiment, the CP 40 is controlled and thereby an output current level switches between a normal time and a time of ILFD adjustment.

A convergence time and stability of the PLL are dependent on an output current from the CP 40. Therefore, by switching the output current from the CP 40, for example the output current from the CP 40 is set low at the normal time in order to mitigate phase noise and the output current from the CP 40 is set high at the time of adjustment in order to shorten the convergence time. With such switching, response characteristics of the PLL circuit 3000 can be maintained in an appropriate manner at each of the normal time and the time of adjustment.

Fourth Embodiment

Figure 8:
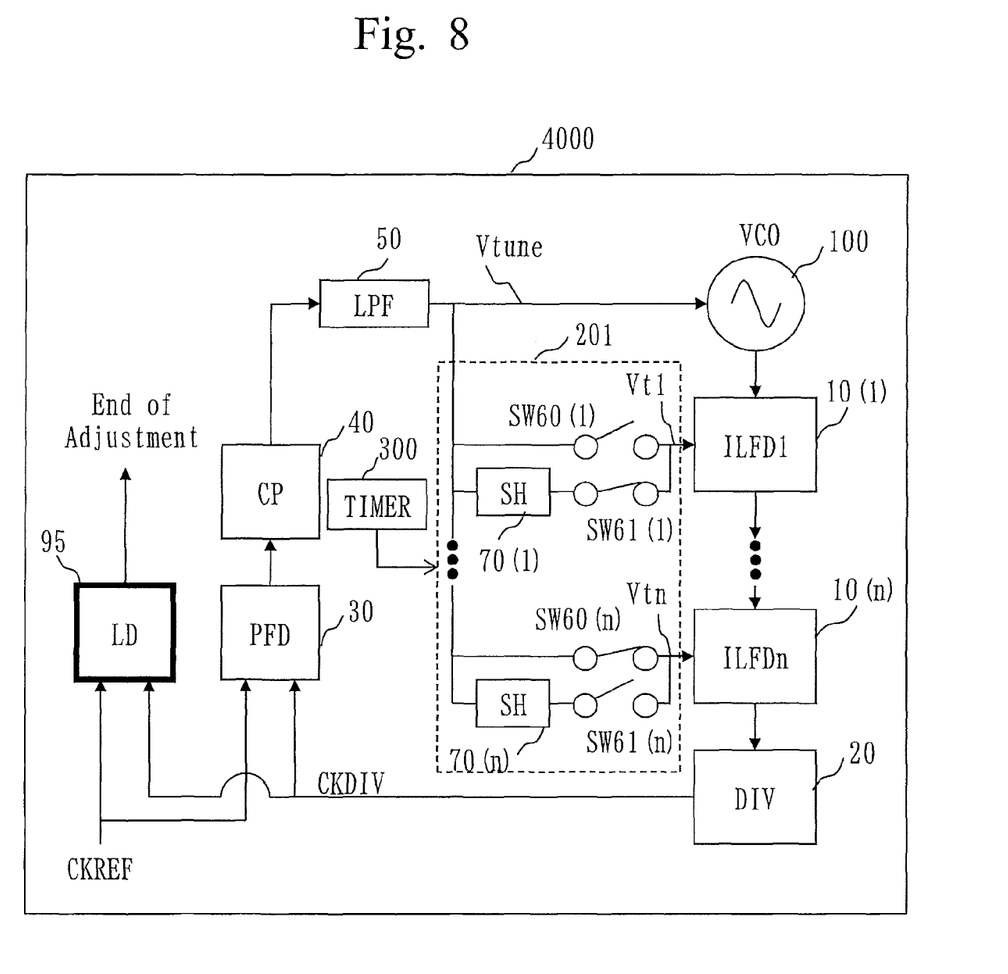
FIG. 8 is a block diagram of a PLL circuit 4000 of a fourth embodiment.

FIG. 8 is a block diagram illustrating a PLL circuit 4000 of a fourth embodiment. Here, only different points from the PLL circuit 1001 of the first embodiment will be described. In the PLL circuit 4000 of the fourth embodiment, a lock detector 95 (hereinafter noted as LD 95) is added as compared to the PLL circuit 1001 in FIG. 1. The LD 95 determines whether a phase difference between CKREF and CKDIV is within a certain range, thereby detecting whether the PLL is in the locked state. When the LD 95 detects the locked state, the timer circuit 300 can determine that adjustment of the ILFD 10 (*k*) (k=1, 2, . . . n) is completed.

A lock-up time of the PLL is influenced by variations in characteristics of an element due to variations in production, temperature, or a source voltage. In the first embodiment, therefore, a sufficient margin is required for a waiting time for lock-up in FIG. 2. On the contrary, according to the PLL circuit 4000 of the fourth embodiment, whether the PLL is locked can be directly judged and thus the ILFD 10 (*k*) can be adjusted in a secured manner.

Figure 9:
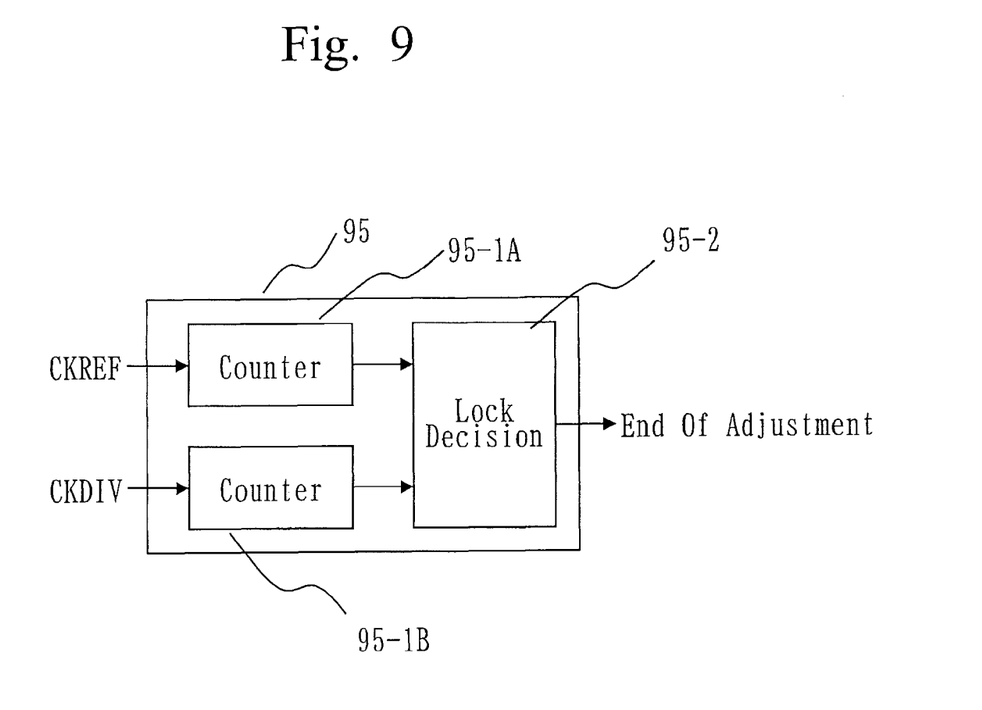
FIG. 9 is a block diagram illustrating an example of a lock detector 95 of the fourth embodiment.

FIG. 9 is a diagram illustrating an exemplary configuration of the LD 95. The LD 95, for example as in FIG. 9, can be implemented by frequency counters 95-1A and 95-1B input with CKREF and CKDIV and a lock decision unit 95-2 to compare count values from the respective frequency counters.

Fifth Embodiment

Figure 10:
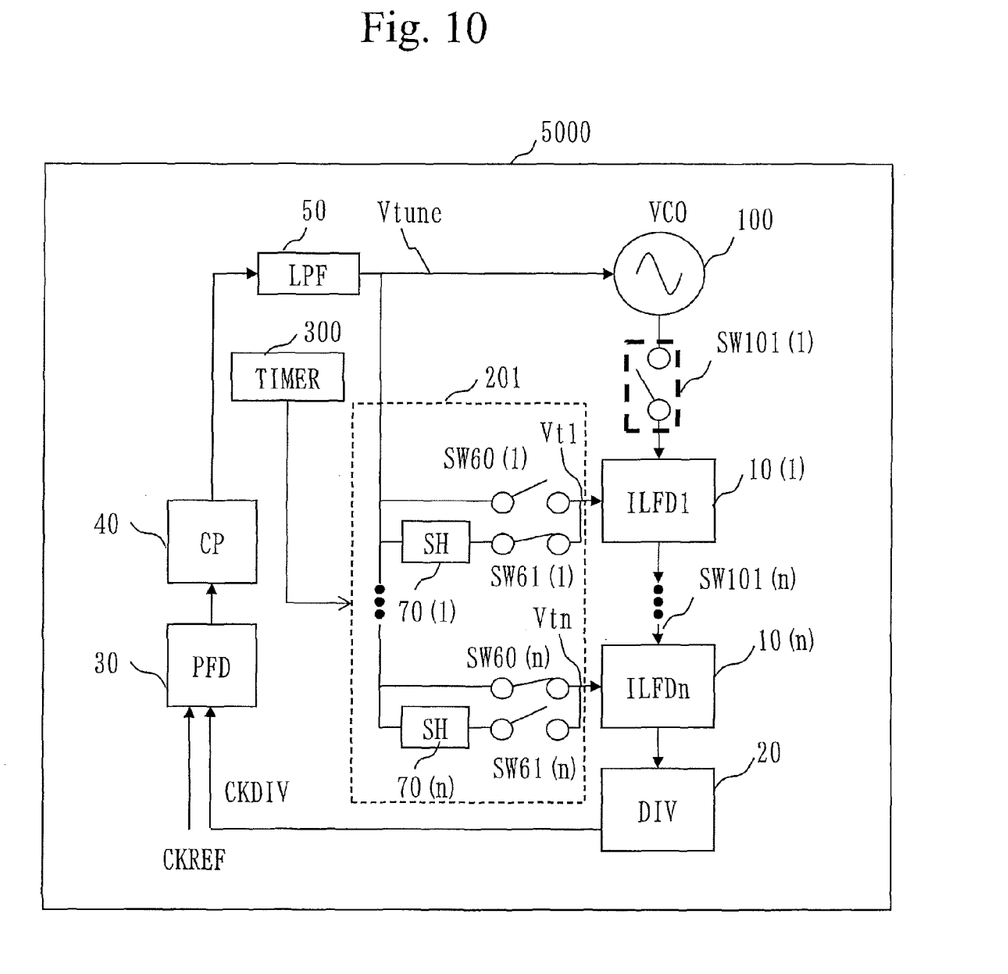
FIG. 10 is a block diagram of a PLL circuit 5000 of a fifth embodiment.

FIG. 10 is a block diagram illustrating a PLL circuit 5000 of a fifth embodiment. Here, only different points from the PLL circuit 1001 of the first embodiment will be described. In the PLL circuit 5000 of the fifth embodiment, a switch 101 (1) to select whether to input a signal from the VCO 100 to the ILFD 10 (1) is added as compared to the PLL circuit 1001 in FIG. 1. During adjustment of the ILFD 10 (1), the timer circuit 300 turns off the switch 101 (1) to interrupt input, to the ILFD 10 (1), of output from the VCO 100. Similarly, switches 101 (2) to 101 (*n*) controlled by the timer circuit 300 are also provided to input portions of the ILFD 10 (2) to ILFD 10 (*n*). As a result, during adjustment of the ILFD 10 (*k*) (k=1, 2, 3, . . . n), the timer circuit 300 turns off the switch 101 (*k*) to interrupt input, to the ILFD 10 (*k*), of an output signal from the preceding unit.

This configuration allows for eliminating the possibility that the ILFD 10 (*k*) synchronizes with a signal from the preceding unit due to input of a signal from the VCO 100 (in the case of the ILFD 10 (1)) or the preceding ILFD (in the case of ILFDs 10 (2) to 10 (*n*)) during adjustment of the ILFD 10 (*k*) (k=1, 2, 3, . . . n), thereby inhibiting the free-run state, and that adjustment thereof is disabled.

In the above embodiments, cases where the PLL circuit includes a plurality of ILFDs 10 have been described; however, the ILFD 10 may be one in number.

In the above embodiments, regarding the PLL circuit, operations of the PLL circuit have been described. It is apparent that the operations of the PLL circuit can be understood as the method of free-run frequency adjustment of the ILFD.

The first to fifth embodiments of the present invention have been described above. Two or more of these embodiments may be implemented in combination thereof. Alternatively, one of these embodiments may be implemented partially. Alternatively, two or more of these embodiments may be implemented in partial combination thereof. Incidentally, the present invention is not limited to these embodiments but may include various modifications as required.

REFERENCE SIGNS LIST

1001, 1002, 1003, 2000, 3000, 4000, 5000: PLL circuit, 10: injection locked frequency divider (ILFD), 20: frequency divider (DIV), 30: phase frequency detector (PFD), 40: charge pump (CP), 50: loop filter (LPF), 60, 61, 101: switch (SW), 70: sample hold circuit (SH), 80: digital/analog converter (DA converter), 90: analog/digital converter (AD converter), 95: lock detector (LD), 100: voltage controlled oscillator (VCO), 201,202,203: supply unit, and 300: timer circuit

The invention claimed is:

1. A phase locked loop circuit, comprising:
an oscillator to output an oscillation signal having a frequency;
a first injection locked frequency divider to be input with the oscillation signal having the frequency output from the oscillator;
a filter to output a voltage to the oscillator; and
a supply unit, comprising:
an output voltage supply unit to fetch the output voltage output from the filter to the oscillator and to supply or block the fetched output voltage to the injection locked frequency divider; and
a hold voltage supply unit to hold the output voltage from the filter and to supply the held output voltage to the injection locked frequency divider when the output voltage supply unit blocks the output voltage.

2. The phase locked loop circuit according to claim 1,
wherein the phase locked loop circuit comprises a plurality of injection locked frequency dividers serially connected with each other wherein the injection locked frequency divider disposed at one of outermost ends in the serial connection of the plurality of injection locked frequency dividers is the first injection locked frequency divider which is input with the oscillation signal,
the supply unit comprises, for each of the injection locked frequency dividers, a pair of the output voltage supply unit and the hold voltage supply unit, the pair corresponding to the injection locked frequency divider,
each of the output voltage supply units supplies or blocks the fetched output voltage to the injection locked frequency divider corresponding thereto, and
each of the hold voltage supply units holds the output voltage from the filter and supplies the held output voltage to the injection locked frequency divider, from which the output voltage is blocked, when the output voltage supply unit making the pair therewith blocks the output voltage to the injection locked frequency divider.

3. The phase locked loop circuit according to claim 2,
wherein the supply unit performs a series of processing for each of the injection locked frequency dividers in the following order, the series of processing comprising:
supplying the output voltage from the filter to the injection locked frequency divider;
holding the output voltage from the filter;
blocking supply of the output voltage to the injection locked frequency divider; and
supplying the held output voltage to the injection locked frequency divider after blockage of the output voltage.

4. The phase locked loop circuit according to claim 2,
wherein the output voltage supply unit comprises a switch, provided to each of the injection locked frequency dividers, to supply or block the output voltage from the filter to the injection locked frequency divider, and
the hold voltage supply unit comprises a sample hold circuit, provided to each of the injection locked frequency dividers, to hold the output voltage from the filter and a switch, provided to each of the injection locked frequency dividers, to supply or block output from the sample hold circuit to the injection locked frequency divider.

5. The phase locked loop circuit according to claim 2,
wherein the output voltage supply unit comprises a switch, provided to each of the injection locked frequency dividers, to supply or block the output voltage from the filter to the injection locked frequency divider, and
the hold voltage supply unit comprises a capacitor provided to each of the injection locked frequency dividers and disposed between the injection locked frequency divider and the switch.

6. The phase locked loop circuit according to claim 2,
wherein the output voltage supply unit comprises a switch, provided to each of the injection locked frequency dividers, to supply or block the output voltage from the filter to the injection locked frequency divider, and
the hold voltage supply unit comprises:
an analog/digital converter to fetch the output voltage from the filter;
a digital/analog converter, provided to each of the injection locked frequency dividers, to fetch output from the analog/digital converter; and
a switch, provided to each of the digital/analog converters and disposed between the digital/analog converter and the injection locked frequency divider, to supply or block an output signal from the digital/analog converter to the injection locked frequency divider.

7. The phase locked loop circuit according to claim 6,
wherein the analog/digital converter is provided to each of the injection locked frequency dividers.

8. The phase locked loop circuit according to claim 1,
wherein a cut-off frequency of the filter is switched when the filter is controlled.

9. The phase locked loop circuit according to claim 1,
wherein the phase locked loop circuit comprises a charge pump to output a current to the filter, wherein a level of the output current is switched when the charge pump is controlled.

10. The phase locked loop circuit according to claim 1,
wherein the phase locked loop circuit comprises a lock detector to detect whether the injection locked frequency divider, which is supplied with the output voltage by the output voltage supply unit, is in a locked state which is determined based on a phase difference between an output signal from the injection locked frequency divider and a reference signal which serves as a reference.

11. The phase locked loop circuit according to claim 2,
wherein the phase locked loop circuit comprises switches, disposed between the oscillator and the first injection locked frequency divider and between each of the injection locked frequency dividers, to be turned on or off when the switch is controlled.

12. A method of free-run frequency adjustment of an injection locked frequency divider in a phase locked loop circuit comprising a supply unit and the injection locked frequency divider, the method comprising:

by the supply unit, fetching an output voltage output from a loop filter to a voltage controlled oscillator and initiating supply of the fetched output voltage to a first injection locked frequency divider;

holding the output voltage from the loop filter as of a point of time when a period of time has been elapsed from initiation of supply of the output voltage and executing blockage of supply of the output voltage to the first injection locked frequency divider; and supplying the held output voltage to the first injection locked frequency divider after blockage of supply of the output voltage to the first injection locked frequency divider.

13. The method of free-run frequency adjustment according to claim 12, wherein the phase locked loop circuit comprises a plurality of injection locked frequency dividers serially connected with each other wherein the injection locked frequency divider disposed at one of outermost ends in the serial connection of the plurality of injection locked frequency dividers is the first injection locked frequency divider which is supplied with the output voltage, the supply unit comprises, for each of the injection locked frequency dividers, a pair of an output voltage supply unit and a hold voltage supply unit, the pair corresponding to the injection locked frequency divider, each of the output voltage supply units fetches the output voltage and supplies or blocks the fetched output voltage to the injection locked frequency divider corresponding thereto, each of the hold voltage supply units holds the output voltage from the loop filter and supplies the held output voltage to the injection locked frequency divider, from which the output voltage is blocked, when the output voltage supply unit making the pair therewith blocks the output voltage to the injection locked frequency divider, and the phase locked loop circuit performs a series of processing for each of the injection locked frequency dividers in the following order using each of the pairs, the series of processing comprising:

initiating supply, by the output voltage supply unit, of the output voltage from the loop filter to the injection locked frequency divider;

holding, by the hold voltage supply unit, the output voltage from the loop filter;

blocking supply, by the output voltage supply unit, of the output voltage to the injection locked frequency divider; and supplying, by the hold voltage supply unit, the held output voltage to the injection locked frequency divider after blockage of the output voltage.

14. The method of free-run frequency adjustment according to claim 13, wherein the plurality of injection locked frequency dividers forms a serial connection among the first injection locked frequency divider connected to the voltage controlled oscillator and one or more injection locked frequency dividers serially connected to the first injection locked frequency divider, and the supply unit executes the series of processing from with the injection locked frequency divider disposed in a farthest place from the voltage controlled oscillator in the serial connection of the plurality of injection locked frequency dividers serially connected with each other.

\* \* \* \* \*